(12) United States Patent
Drogi et al.

(10) Patent No.: US 11,469,714 B2
(45) Date of Patent: *Oct. 11, 2022

(54) AUTOMATED ENVELOPE TRACKING SYSTEM

(71) Applicant: SKYWORKS SOLUTIONS, INC., Irvine, CA (US)

(72) Inventors: Serge Francois Drogi, Flagstaff, AZ (US); Florinel G. Balteanu, Irvine, CA (US); Luigi Panseri, Pleasanton, CA (US); Craig Joseph Christmas, Irvine, CA (US); Paul T. DiCarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,581

(22) Filed: Nov. 11, 2020

(65) Prior Publication Data

US 2021/0167733 A1 Jun. 3, 2021

Related U.S. Application Data

(63) Continuation of application No. 16/380,757, filed on Apr. 10, 2019, now Pat. No. 10,862,430, which is a (Continued)

(51) Int. Cl.
*H03F 1/02* (2006.01)
*H03F 1/56* (2006.01)
(Continued)

(52) U.S. Cl.
CPC ........... *H03F 1/0227* (2013.01); *H03F 1/565* (2013.01); *H03F 3/191* (2013.01); *H03F 3/217* (2013.01);
(Continued)

(58) Field of Classification Search
None
See application file for complete search history.

(56) References Cited

U.S. PATENT DOCUMENTS

| | | |
|---|---|---|
| 5,929,776 A | 7/1999 | Warble et al. |
| 6,191,653 B1 | 2/2001 | Camp, Jr. et al. |
| | (Continued) | |

FOREIGN PATENT DOCUMENTS

| | | |
|---|---|---|
| CN | 1829079 | 9/2006 |
| CN | 101090380 | 12/2007 |
| | (Continued) | |

OTHER PUBLICATIONS

Hassan et al., A Combined Series-Parallel Hybrid Envelope Amplifier for Envelope Tracking Mobile Terminal RF Power Amplifier Applications, IEEE Journal of Solid-State Circuits, pp. 1185-1198, vol. 47, No. 5, May 2012.

*Primary Examiner* — Walter J DiVito
(74) *Attorney, Agent, or Firm* — Knobbe, Martens, Olson & Bear, LLP

(57) ABSTRACT

Embodiments described herein relate to an envelope tracking system that uses a single-bit digital signal to encode an analog envelope tracking control signal, or envelope tracking signal for brevity. In certain embodiments, the envelope tracking system can estimate or measure the amplitude of the baseband signal. The envelope tracking system can further estimate the amplitude of the envelope of the RF signal. The system can convert the amplitude of the envelope signal to a single-bit digital signal, typically at a higher, oversample rate. The single-bit digital signal can be transmitted in, for example, a low-voltage differential signaling (LVDS) format, from a transceiver to an envelope tracker. An analog-to-digital converter (ADC or A/D) can convert the single-bit digital signal back to an analog envelope signal. Moreover, a driver can increase the power of the A/D (Continued)

output envelope signal to produce an envelope-tracking supply voltage for a power amplifier.

20 Claims, 11 Drawing Sheets

Related U.S. Application Data continuation of application No. 15/392,186, filed on Dec. 28, 2016, now Pat. No. 10,270,394.

(60) Provisional application No. 62/272,958, filed on Dec. 30, 2015.

(51) Int. Cl.
  *H03F 3/191* (2006.01)
  *H03F 3/217* (2006.01)
  *H03F 3/24* (2006.01)

(52) U.S. Cl.
  CPC ....... *H03F 3/245* (2013.01); *H03F 2200/102* (2013.01); *H03F 2200/331* (2013.01); *H03F 2200/336* (2013.01); *H03F 2200/451* (2013.01)

(56) References Cited

U.S. PATENT DOCUMENTS

| | | |
|---|---|---|
| 7,342,445 B2 | 3/2008 | Aridas et al. |
| 7,420,411 B2 | 9/2008 | Herzinger et al. |
| 7,696,818 B2 | 4/2010 | Kunihiro et al. |
| 7,696,826 B2 | 4/2010 | Ripley et al. |
| 7,978,008 B2 | 7/2011 | Ito et al. |
| 8,493,142 B2 | 7/2013 | Tadano |
| 8,570,105 B2 | 10/2013 | Wimpenny et al. |
| 8,981,847 B2 | 3/2015 | Balteanu |
| 9,143,096 B2 | 9/2015 | Balteanu et al. |
| 9,294,054 B2 | 3/2016 | Balteanu et al. |
| 9,668,215 B2 | 5/2017 | Balteanu et al. |
| 10,080,192 B2 | 9/2018 | Balteanu et al. |
| 10,270,394 B2 | 4/2019 | Drogi et al. |
| 2004/0027261 A1 | 2/2004 | Tymchuk et al. |
| 2005/0064830 A1 | 3/2005 | Grigore |
| 2006/0119425 A1 | 6/2006 | Phillips et al. |
| 2008/0012637 A1 | 1/2008 | Aridas et al. |
| 2008/0258831 A1 | 10/2008 | Kunihiro et al. |
| 2009/0088096 A1 | 4/2009 | Sun et al. |
| 2009/0096531 A1 | 4/2009 | Shimamoto et al. |
| 2011/0279180 A1 | 11/2011 | Yamanouchi et al. |
| 2011/0298545 A1 | 12/2011 | Morimoto et al. |
| 2012/0194274 A1 | 8/2012 | Fowers et al. |
| 2013/0342383 A1 | 12/2013 | Kojima |
| 2015/0103945 A1 | 4/2015 | Maehata |
| 2016/0174153 A1 | 6/2016 | Balteanu et al. |
| 2016/0204809 A1 | 7/2016 | Pratt et al. |
| 2016/0241138 A1 | 8/2016 | Pehlke |
| 2017/0195972 A1 | 7/2017 | Drogi et al. |
| 2017/0223632 A1 | 8/2017 | Balteanu et al. |
| 2019/0341888 A1 | 11/2019 | Drogi et al. |

FOREIGN PATENT DOCUMENTS

| | | |
|---|---|---|
| CN | 101098171 | 1/2008 |
| CN | 101674056 | 3/2010 |
| CN | 101807890 | 8/2010 |
| CN | 102013876 | 4/2011 |
| JP | H 10-507832 | 7/1998 |
| KR | 10-0581268 | 9/2006 |
| KR | 2014-0026510 | 3/2014 |
| WO | WO 96/12630 | 5/1996 |
| WO | WO 98/00929 | 1/1998 |

AUTOMATED ENVELOPE TRACKING SYSTEM

RELATED APPLICATIONS

This application is a continuation of U.S. application Ser. No. 16/380,757, which was filed on Apr. 10, 2019 and is titled "AUTOMATED ENVELOPE TRACKING SYSTEM," the disclosure of which is expressly incorporated by reference herein in its entirety for all purposes and which is a continuation of U.S. application Ser. No. 15/392,186, which was filed on Dec. 28, 2016 and is titled "AUTOMATED ENVELOPE TRACKING SYSTEM," the disclosure of which is expressly incorporated by reference herein in its entirety for all purposes, and which claims priority to U.S. Provisional Application No. 62/272,958, which was filed on Dec. 30, 2015 and is titled "AUTOMATED ENVELOPE TRACKING SYSTEM," the disclosure of which is expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Technical Field

This disclosure relates to an automated envelope tracking system.

Description of Related Technology

Wireless device manufacturers continue to add new features to wireless devices (e.g., smartphones). Often, the new features will cause a reduction in the battery life of the wireless device. This reduction in battery life is in direct opposition to many users' desire for longer battery life.

As users move in relation to a wireless base station, the amount of power for maintaining a communication connection with the wireless base station may vary. Often, a wireless device may use a particular amount of power to ensure that the communication connection is maintained regardless of the distance to the base station within a particular range of the base station. One element in the wireless device that may require different amounts of power based on its distance to the base station is the power amplifier that processes the radio frequency signal for transmission.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

SUMMARY

Figure 1:
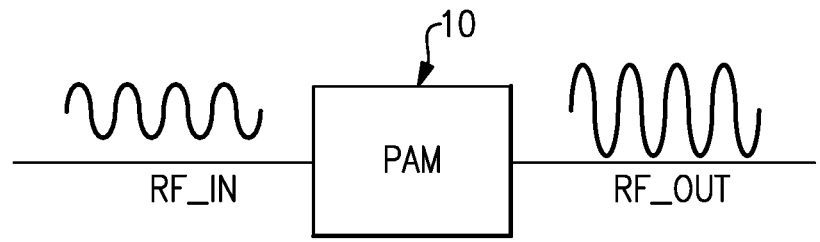
FIG. 1 illustrates a block diagram of a power amplifier module for amplifying a radio frequency (RF) signal.

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to an envelope tracking system. The envelope tracking system can include a signal measuring device configured to determine a size of a radio frequency input signal. Further, the envelope tracking system may include a bit-encoder configured to encode an envelope tracking control signal to obtain an encoded envelope tracking control signal. The envelope tracking control signal may be based at least in part on the size of the radio frequency input signal. In addition, the envelope tracking system may include an envelope tracker configured to provide a supply voltage to a power amplifier. The supply voltage may be based at least in part on the encoded envelope tracking control signal.

The signal measuring device may determine the size of the radio frequency input signal by determining an amplitude of an I and Q component of a baseband signal associated with the RF input signal. Determining the amplitude of the radio frequency input signal may include obtaining the absolute value of the amplitude of the I and Q components associated with the RF input signal.

In some implementations, the signal measuring device implements a coordinate rotation digital computer algorithm. Further, the bit-encoder may include a sigma-delta modulator. The envelope tracking system may also include a lookup table storing a plurality of envelope tracking control values. The envelope tracking control signal may be generated based at least in part on the size of the radio frequency input signal or a selection of an envelope tracking control value from the plurality of envelope tracking control values.

The envelope tracking system may also include a pair of low-voltage differential signaling lines configured to communicate the encoded envelope tracking control signal from the bit-encoder to the envelope tracker. Further, the envelope tracker may include a digital to analog converter configured to convert the encoded envelope tracking control signal to an analog signal. In addition, the envelope tracker may include a driver configured to generate the supply voltage. The size of the radio frequency input signal may include an instantaneous amplitude of the radio frequency input signal.

Certain embodiments of the present disclosure relate to a wireless device. The wireless device may include a transceiver and a front-end module. The transceiver may include a signal measuring device and a bit-encoder. The signal measuring device may be configured to determine a size of a radio frequency input signal. The bit-encoder may be configured to encode an envelope tracking control signal to obtain an encoded envelope tracking control signal. The envelope tracking control signal may be based at least in part on the size of the radio frequency input signal. The front-end module may be in communication with the transceiver. Further, the front-end module may include an envelope tracker configured to provide a supply voltage to a power amplifier. The supply voltage may be based at least in part on the encoded envelope tracking control signal.

Some implementations of the wireless device may include a plurality of front-end modules. At least some of the front-end modules may include one or more power amplifiers configured to process signals of different frequency bands than at least some other of the front-end modules. The plurality of front-end modules may be in communication with the transceiver via a plurality of pairs of low-voltage differential signaling lines. At least one of the pairs of low-voltage differential signaling lines may be of a different length than at least one other pair of low-voltage differential signaling lines.

In some embodiments, the bit-encoder includes a sigma-delta modulator. Moreover, the transceiver may further include a non-volatile storage configured to store a mapping of a plurality of radio frequency input size values to a plurality of envelope tracking control values. The envelope tracking control signal may be determined based at least in part on the size of the radio frequency input signal and the mapping of the plurality of radio frequency input size values to the plurality of envelope tracking control values. In some cases, the envelope tracker includes a digital to analog converter configured to convert the encoded envelope tracking control signal to an analog signal. Further, the envelope tracker may include a driver configured to modify a voltage received from a battery to obtain the supply voltage for the power amplifier.

Certain aspects of the present disclosure relate to a method of envelope-tracking a radio frequency signal. The method may include receiving I and Q components of a radio frequency signal and determining an expected size of the radio frequency signal based on a measurement of the I and Q components. Further, the method may include determining a control signal based at least in part on the expected size of the RF signal. The control signal may indicate a voltage envelope for the radio frequency signal. In addition, the method may include converting the control signal to a low-voltage differential signaling format using a single-bit encoder to obtain an encoded control signal. The method may further include providing the encoded control signal to an envelope tracker. In some embodiments, in response to providing the encoded control signal to the envelope tracker, the method may further include modifying a device supply voltage based at least in part on the encoded control signal and providing the modified device supply voltage to a power amplifier that receives the radio frequency signal.

DETAILED DESCRIPTION

The headings provided herein, if any, are for convenience only and do not necessarily affect the scope or meaning of the claimed invention. For the purpose of the present disclosure, the terms mobile devices and wireless devices are used interchangeably.

Introduction

Power amplifiers can be included in mobile or wireless devices to amplify radio frequency (RF) signals for transmission via one or more antennas. For example, in mobile devices using frequency division duplexing (FDD), such as systems using long term evolution (LTE), a power amplifier can be used to amplify one or more transmit carrier frequencies. It can be important to manage RF signal amplification to maintain transmission range and to conserve battery life. A desired transmit power level can depend on the mobile environment and/or a user's distance from a base station.

With the constant desire for longer battery life, the power consumption of a power amplifier can be an important consideration. One technique for reducing power consumption of a power amplifier is the use of envelope tracking, which can include controlling a supply voltage of the power amplifier relative to the envelope of the RF signal or signal envelope. Thus, when a voltage level of the signal envelope increases, the voltage level of the power amplifier supply voltage can be increased. Likewise, when the voltage level of the signal envelope decreases, the voltage level of the power amplifier supply voltage can be decreased to reduce power consumption.

The use of envelope tracking can create a timing requirement on the system. Specifically, the supply voltage should track the RF signal envelope in the time domain to avoid introducing degradation to the RF signal due, for example, to clipping of the RF signal. Clipping of the RF signal may occur when the RF signal has a higher voltage than the supply voltage. The RF signal may have a higher voltage than the supply voltage, for example, when the RF signal envelope increases in voltage more than the increase in supply voltage due to a lag in tracking the RF signal envelope voltage.

The demand for higher data rates in mobile and wireless communication devices has created technical challenges for power amplifier systems. For example, certain mobile devices operate using carrier aggregation in which the mobile device communicates across multiple carriers, which can be in the same frequency band or in different frequency bands. Although carrier aggregation can increase bandwidth, carrier aggregation can have relatively stringent power amplifier linearity specifications. Furthermore, certain mobile devices can operate over a wide range of frequencies, including high frequency bands in which power amplifiers may exhibit relatively poor linearity.

In some cases, the demand for higher date rates in mobile and wireless communication devices can be addressed using Multiple Input Multiple Output (MIMO) systems with spatially separated diversity antennas. To reduce RF interference, a power amplifier is typically placed in close proximity to the antenna connected to the power amplifier. In some MIMO systems, spatially separated antennas may result in spatially separated power amplifiers. In a conventional design, the spatially separated power amplifiers may share the same sources of RF signals and analog envelope-tracking signals from a single transceiver. The spatial separation of the power amplifiers can cause differences in propagation lengths or delays and in frequency responses of the transmission paths between the single transceiver and the plurality of power amplifiers. These differences can become even more pronounced at the high bandwidths that may be used to support high data rates. Left uncompensated for, these differences can result in distortions in the amplified RF signal produced, for example, by the clipping effect described above. This reduced RF signal integrity can degrade communication system performance (for example, by increasing a RF channel's out-of-band emission) and can cause the system to fall short of the requirements imposed by a communication standard. Thus, in some cases, analog envelope-tracking signals generated by a transceiver with a conventional envelope tracking system often need to be calibrated to compensate for the differences in signal distortions created by the different frequency responses and path delays to the different power amplifiers. Furthermore, frequency response and path delays may limit the bandwidth of a conventional envelope tracking system to 40 MHz, as an example.

Although the above description uses a MIMO system to illustrate some technical challenges to the design of envelope tracking systems, at least some of these technical challenges may also occur in Single Input Single Output (SISO) systems. In other words, regardless of the number of power amplifiers in the system, delay and/or degradation of the RF signal may occur between a transceiver and a power amplifier.

Embodiments described herein relate to an envelope tracking system that uses a single-bit digital signal to encode an analog envelope tracking control signal, or envelope tracking signal for brevity. In certain embodiments, the envelope tracking system can estimate or measure the amplitude of the baseband signal. The envelope tracking system can further estimate the amplitude of the envelope of the RF signal. The system can convert the amplitude of the envelope signal to a single-bit digital signal, typically at a higher, oversample rate. The single-bit digital signal can be transmitted in, for example, a low-voltage differential signaling (LVDS) format, from a transceiver to an envelope tracker. An analog-to-digital converter (ADC or A/D) can convert the single-bit digital signal back to an analog envelope signal. Moreover, a driver can increase the power of the A/D output envelope signal to produce an envelope-tracking supply voltage for a power amplifier.

Advantageously, in certain embodiments, because transmitting a single-bit digital signal from a transceiver to a power amplifier module generally does not suffer from the limitations associated with transmitting a high-bandwidth analog signal, embodiments according to the present disclosure can support an envelope-tracking signal with bandwidth up to or exceeding 300 MHz. In contrast, many conventional systems are limited to bandwidths of 40 MHz or less for the envelope-tracking signal.

Example Power Amplifier Module

FIG. 1 is a block diagram of a power amplifier module (PAM) 10 for amplifying a radio frequency (RF) signal. The illustrated power amplifier module 10 amplifies an RF signal (RF_IN) to generate an amplified RF signal (RF_OUT). As described herein, the power amplifier module 10 can include one or more power amplifiers.

Example Wireless Device

Figure 2:
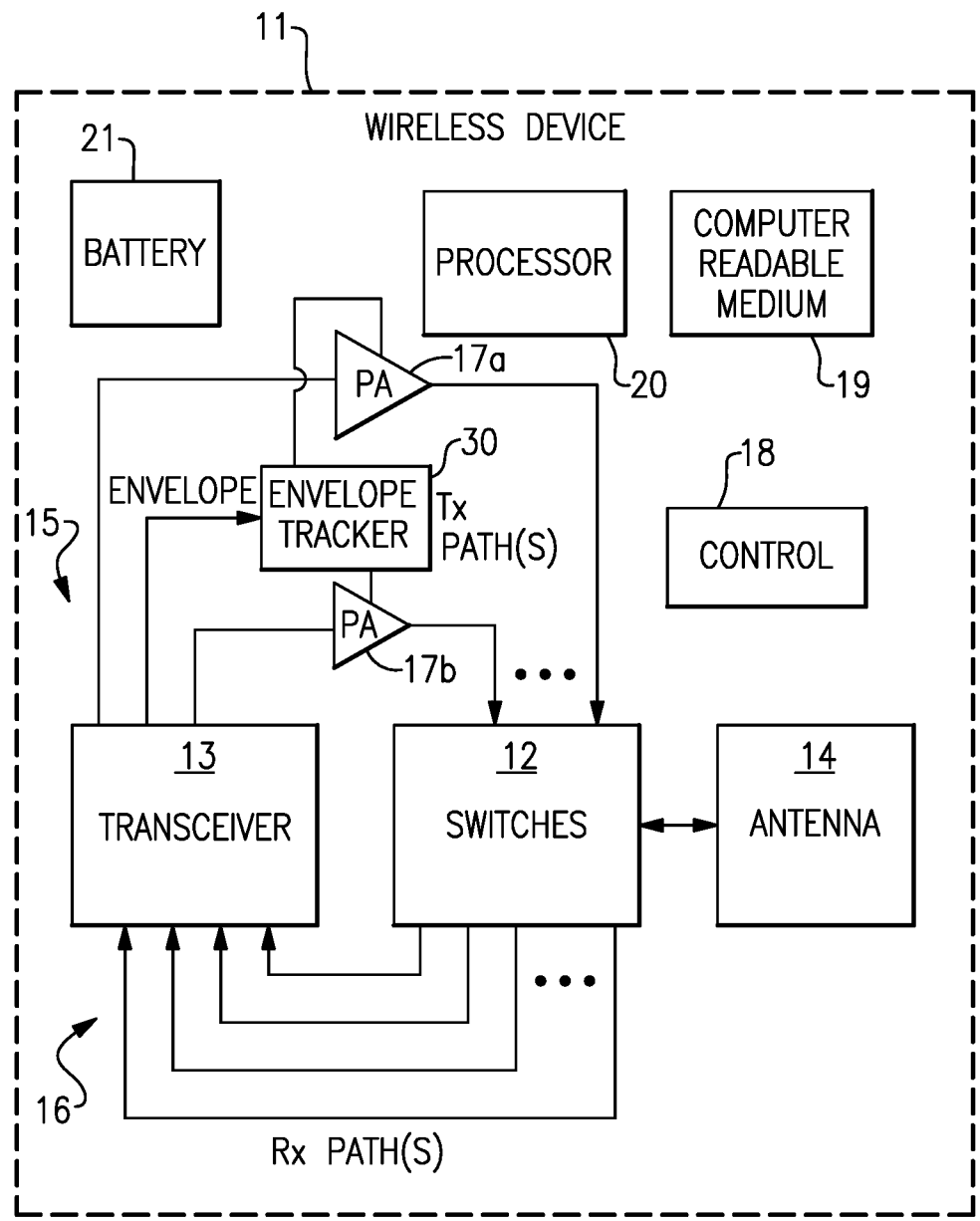
FIG. 2 illustrates a block diagram of an example wireless device that can include one or more of the power amplifier modules of FIG. 1.

FIG. 2 is a block diagram of an example wireless or mobile device 11 that can include one or more of the power amplifier modules 10 of FIG. 1. The wireless device 11 can also include an envelope tracking system implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64-QAM signals.

In certain embodiments, the wireless device 11 can include switches 12, a transceiver 13, an antenna 14, power amplifiers 17a, 17b, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and reception of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and reception of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers. In the remainder of the disclosure, a power amplifier in a wireless device may be individually referred to as power amplifier 17a, power amplifier 17b, etc., or may be individually or collectively referred to as power amplifier(s) 17.

In FIG. 2, one or more detected signals from the antenna 14 are depicted as being provided to the transceiver 13 via one or more receiving paths 16. In the example shown in FIG. 2, different receiving paths 16 can represent paths associated with different bands. For example, the four example receiving paths 16 shown can represent quad-band capability with which some wireless devices are provided. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the envelope tracker 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the envelope tracker 30, which can be used to provide power amplifier supply voltages to one or more of the power amplifiers 17a, 17b. For example, the envelope tracker 30 can be configured to change the supply voltages provided to the power amplifiers 17a, 17b based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17a, 17b, the power consumed from the battery 21 can be reduced, thereby improving the battery life of the wireless device 11. In certain configurations, the power amplifiers 17a, 17b can be implemented using CMOS processing, which can lower cost and/or enhance integration. However, other configurations of the power amplifiers 17a, 17b are possible. For example, the power amplifiers 17a, 17b can be implemented using III-V semiconductor processing, such as Gallium Arsenide (GaAs) processing.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Example Power Amplifier Supply Voltage Signals

Figure 3A:
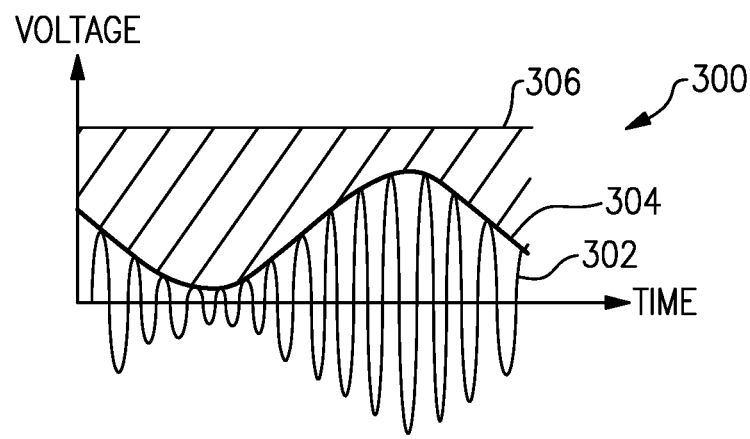
FIGS. 3A-3B illustrate two examples of a power amplifier supply voltage versus time.
Figure 3B:
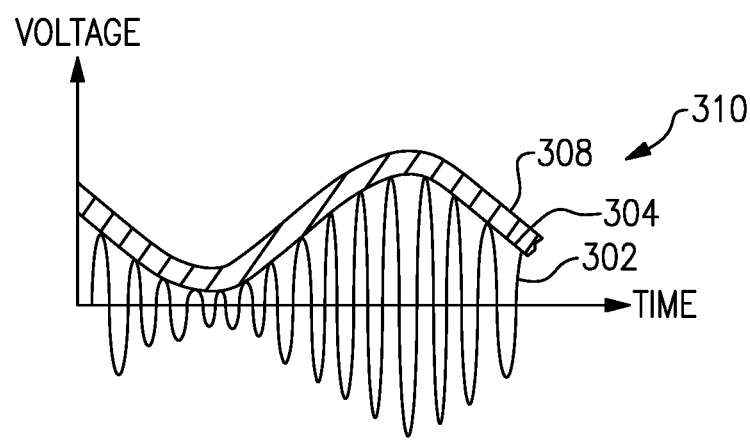

FIGS. 3A-3B show two examples of power amplifier supply voltage versus time. In FIG. 3A, a graph 300 illustrates one example of the voltage of an RF signal 302 and a power amplifier supply voltage 306 versus time. The RF signal 302 has an envelope 304.

It can be important that the power amplifier supply voltage 306 of a power amplifier has a voltage greater than that of the RF signal 302. For example, powering a power amplifier using a power amplifier supply voltage that has a magnitude less than that of the RF signal can cause the RF signal to be clipped, thereby creating signal distortion and/or otherwise degrading signal integrity. Thus, it can be important that the power amplifier supply voltage 306 be greater than that of the envelope 304. However, it can be desirable to reduce a difference in voltage between the power amplifier supply voltage 306 and the envelope 304 of the RF signal 302, as the area between the power amplifier supply voltage 306 and the envelope 304 can represent lost energy, which can reduce battery life and increase heat generated in a wireless device.

In FIG. 3B, a graph 310 illustrates another example of the voltage of an RF signal 302 and a power amplifier supply voltage 308 versus time. In contrast to the power amplifier supply voltage 306 of FIG. 3A, the power amplifier supply voltage 308 of FIG. 3B changes in relation to the envelope 304 of the RF signal 302. The area between the power amplifier supply voltage 308 and the envelope 304 in FIG. 3B is less than the area between the power amplifier supply voltage 306 and the envelope 304 in FIG. 3A, and thus the graph 310 of FIG. 3B can be associated with a power amplifier system having greater energy efficiency.

Example Envelope Tracking System

Figure 4:
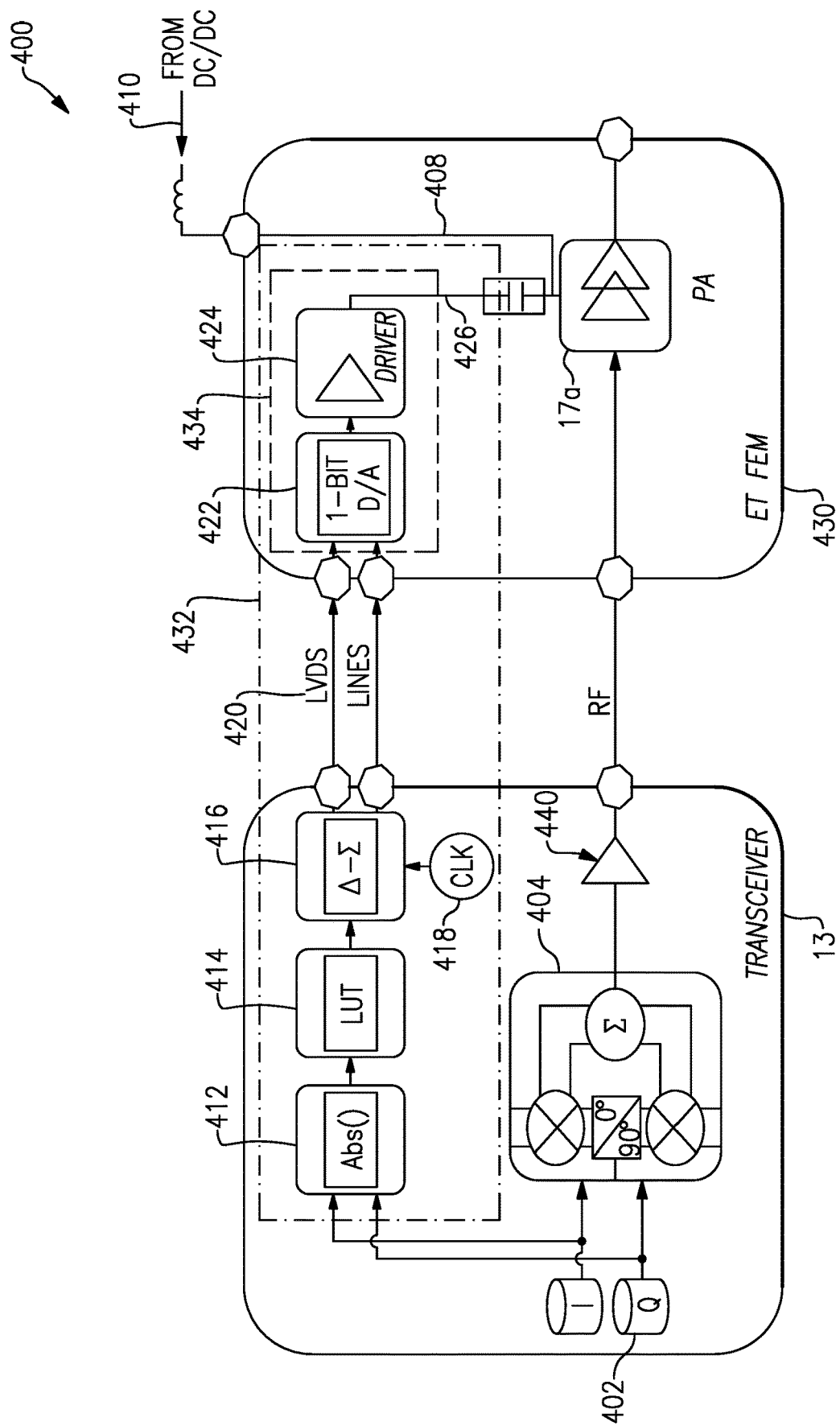
FIG. 4 is a block diagram of an embodiment of a communication subsystem including a transceiver and a front-end module (FEM).

FIG. 4 illustrates a block diagram of one embodiment of a communication subsystem 400 including an envelope tracking system 432. The illustrated communication subsystem 400 includes a transceiver 13 and an envelope tracking front end module (ET FEM) 430. The illustrated transceiver 13 includes a baseband processor 402, an I/O modulator 404, a signal estimation component 412, an envelope-shaping look-up table (LUT) 414, a delta-sigma modulator 416, and a clock 418. The delta-sigma modulator 416 and the clock 418 may together be referred to as a bit encoder. As illustrated, the signal estimation component 412 may implement a vector length function or an absolute value function to calculate the magnitude of the baseband I/O signals. This absolute value function for calculating the baseband I/O signals may include calculating the square root of the I/O components squared: sqrt(I^2+Q^2). The signal estimation component and the envelope-shaping LUT may together be referred to as a signal measuring device.

Further, the illustrated ET FEM includes a power amplifier 17a, a 1-bit digital-to-analog converter (DAC or D/A) 422, and a driver 424. The signal estimation component 412, e.g., an absolute value function, the look-up table (LUT) 414, the delta-sigma modulator 416, the clock 418, the 1-bit D/A 422, and the driver 424 may be included as components of the envelope tracking system 432. The 1-bit D/A 422 and the driver 424 may be included as portions of the envelope tracking system 432 within the ET FEM 430 and are collectively designated as an envelope tracker 434.

The baseband processor 402 can be used to generate an I signal component and a Q signal component of a baseband signal. The I and Q signal components can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave. The composite of I and Q signals can be an equivalent representation of the sinusoidal wave. In certain implementations, the I and Q signals can be provided to the I/O modulator 404 in a digital format. The baseband processor 402 can be any suitable processor configured to process a baseband signal. For instance, the baseband processor 402 can include a digital signal processor, a microprocessor, a programmable core, or any combination thereof. Moreover, in some implementations, two or more baseband processors 402 can be included in the communication subsystem 400.

The I/O modulator 404 can be configured to receive the I and Q signals from the baseband processor 402 and to process the I and Q signals to generate an RF signal based on the received baseband signal. For example, the I/O modulator 404 can include one or more DACs configured to convert the I and Q signals into an analog format, mixers for upconverting the I and Q signals to radio frequency signals, and a signal combiner for combining the upconverted I and Q signals into an RF signal that can be amplified by the power amplifier 17a. Thus, the I/O modulator 404 may function as an upconverter and may convert a baseband signal into the RF signal. In certain implementations, the I/O modulator 404 can include one or more filters configured to filter frequency content of signals processed therein.

The RF signal produced by the I/O modulator 404 is output from the transceiver 13 to the ET FEM 430, which provides the RF signal to the power amplifier 17a. In some cases, the output of the I/O modulator 404 is provided to a radio frequency (RF) driver 440 that amplifies the RF signal before providing it to the ET FEM 430. This RF driver 440 may include one or more transistors or power amplifiers that can be used to amplify the RF signal. Amplifying the RF signal helps to maintain the signal integrity as it is transmitted to the ET FEM 430. This is particularly important in embodiments where the ET FEM 430 is not directly adjacent to the transceiver 13. The transceiver 13 and the ET FEM 430 may be spatially separated due to space constraints in the device. They may also be separated due to the desire to separate corresponding antennas of the ET FEMs in a multiple antenna device. It is generally desirable to separate the plurality of antennas to reduce signal interference between signals received or transmitted by the different antennas. The power amplifier 17a may amplify the RF signal to a power level sufficient to reach a selected destination (e.g., a base station) with adequate signal integrity (e.g., signal integrity that satisfies a signal integrity threshold of, for example, the base station).

The signal estimation component 412 can perform one or more processes for measuring characteristics of the I and Q components of the baseband signal, such as measuring the magnitude of the signal components. The baseband signal may include a signal that extends from 0 up to a particular frequency. In contrast, the RF signal may be associated with a lower frequency and a higher frequency, but may not extend to DC. The baseband signal may represent the envelope signal for transmitting an RF signal.

To measure signal magnitude, the signal estimation component may be implemented as any system that can determine an approximate magnitude of the baseband I/O signals. FIG. 4 illustrates the signal estimation component 412 implemented as a vector length function. The signal estimation component 412 may, for example, estimate the magnitude of the baseband I/O signals by using floating-point or fixed-point arithmetic to compute the square root of $(I^2+Q^2)$. The square root computation, in turn, may be implemented in a variety of ways. For example, a look-up table may be used to derive the square root of a fixed-point number. Alternatively, a Taylor series of an arbitrary length may be used to compute a square root. A person of ordinary skill in the art will appreciate that a system that can determine the magnitude of the baseband I/O signals to varying degrees of accuracy may be used as a signal estimation component 412 in the place of the absolute value or vector length function illustrated in FIG. 4.

The envelope-shaping look-up table (LUT) 414 can be used to convert a magnitude signal associated with the I and Q signals (e.g., the output of the signal estimation component) into a shaped envelope signal. Shaping may be used to map amplitude values of the input signal to a selected voltage. Alternatively, a polynomial function could be used to obtain the same or a similar effect as shaping the signal. Shaping the envelope signal from the baseband processor 402 can aid in enhancing performance of the communication subsystem 400. As illustrated in FIG. 4, the envelope-shaping look-up table (LUT) 414 comprises a look-up table, such as a programmable memory, configured to generate a digital shaped envelope signal which can be converted into an analog shaped envelope signal for supply to the power amplifier 17a. The look-up table can store a plurality of baseband I/O magnitude values and the corresponding envelope tracking control signal values. The look-up table can receive a digital input signal indicating a voltage level of the magnitude signal (e.g. output of the signal estimation component 412), and can generate a digital output signal indicating a voltage level of the envelope signal. The look-up table may be stored in a non-volatile storage. However, a shaped envelope signal can be generated via means other than a look-up table or a look-up table with baseband I/O signal magnitude-to-envelope mapping. For example, it is feasible, in some cases, to use the output of I/O modulator 404 as input to the look-up table 414. Alternatively, it is feasible to generate an envelope signal by low-pass filtering the output of I/O modulator 404 without the use of a look-up table 414.

The mapping stored in the look-up table 414, e.g., a plurality of baseband I/O magnitude values and the corresponding envelope tracking control signal values, may be dependent on the RF frequency of the RF signal. Thus, the look-up table 414 may include multiple tables where the communication subsystem 400 may transmit in one of a plurality of RF frequencies.

The delta-sigma modulator 416 applies delta-sigma modulation to the envelope signal output from LUT 414 to encode the envelope signal using a single bit. This single-bit output can be a representation of the polarity of the slope of the envelope signal at the time of the delta-sigma sampling time. For example, if the envelope signal is increasing in amplitude (e.g., the slope is positive), the output of the delta-sigma modulator 416 may be set to a supply voltage of the transceiver (not shown). If the envelope signal is decreasing in amplitude (e.g., slope is negative), the output of the delta-sigma modulator 416 may be set to zero volts or a minimum voltage. As another example, if the envelope signal is neither increasing nor decreasing in amplitude at the sampling time, the output of the delta-sigma modulator 416 may remain at the same value from the last sampling period. Though not shown in FIG. 4, the output of the delta-sigma modulator 416 can be an input to a component which converts the output of the delta-sigma modulator 416 to the LVDS format.

The clock 418 can provide the clock signal at which the delta-sigma modulator 416 operates. In some cases, to represent an envelope-tracking signal using one bit resolution, the delta-sigma modulator 416 may operate at an oversample clock rate. For example, the oversample clock rate may be ten to fifteen times the bandwidth of the envelope signal or the corresponding RF signal. For instance, the envelope-tracking signal may be sampled at 200 mega-samples per second (Msps) to generate an envelope-tracking signal with 20 MHz bandwidth at the output of envelope tracking system 432.

The transceiver 13 outputs the output signal of delta-sigma modulator 416 in LVDS format on lines 420. The LVDS format uses digital differential signals, hence each signal may be transferred to the ET FEM 430 on one line of a pair of lines. The information transmitted on the lines 420 may then be determined based on a voltage difference between the two lines.

It should be understood that LVDS is one non-limiting example for representing the envelope information and for providing the envelope information to the ET FEM 430. Other systems and methods for encoding or transmitting the envelope information are possible. These other methods may also maintain the digital format of the signals. For example, in some implementations, the LVDS lines 420 can be replaced with a single wire interface. This single wire interface can be used as a serial interface. Further, the single wire interface can combine a clock and data signal on a single line. For example, the data can be encoded on the line by modifying the frequency of the clock signal. Alternatively, the data can be encoded by adjusting the amplitude of the clock signal while maintaining the clock frequency. Although providing the clock signal is possible, it is generally not desired because it can create a noise source on the clock signal of the transceiver 13. The clock signal can generate a high power tone, which may be upconverted and produce noise. By using a delta-sigma modulator, the clock noise can be spread out minimizing its impact.

Another alternative to using the LVDS lines is to use a non-return to zero signal over the single line. In such an implementation, the clock may be implicit with the data because, for example, every bit is clocked one clock period. These alternative options are noisier than using a sigma-delta bit stream as used by embodiments disclosed herein. Using the sigma delta bit stream, the clock is not transmitted, but may be recovered by the ET FEM 430.

While the illustrated embodiments using a 1-bit encoder, it should be understood that the present disclosure is not limited as such. For example, multiple pairs of LVDS lines may be between the transceiver 13 and the ET FEM 430 enabling the transmission of multiple bits. In such cases, the ET FEM 430 may include multiple 1-Bit D/As 422 or the D/A 422 may support multiple bits. In other embodiments, the lines between the transceiver 13 and the ET FEM 430 may be configured to provide multiple bits by, for example, using multiple amplitude levels to represent different digital values.

Advantageously, in certain embodiments, interference produced by the digital LVDS signals on lines 420 may cause less degradation to the RF signal than an analog envelope signal transmitted from a transceiver to an FEM. The lower degradation may occur because, in some cases, the digital LVDS signals on lines 420 operate at a much higher sample rate compared with the bandwidth of the RF signal. Thus interference produced by the signals may appear to be white noise (e.g., signals with a flat spectral density rather than having discrete spurious components) in the bandwidth of the RF signal. In contrast, an analog envelope signal may have a similar bandwidth as the RF signal and tends to produce a spurious interference in the RF bandwidth. The interference becomes more like white noise with increasing sample rate. In some cases, as the sample rate increases, the spectral density may become closer to that of a white noise signal. Thus, even though the LVDS lines connecting the transceiver 13 and the ET FEM 430 may produce interference due, for example, to a transmission line effect, the interference tends to cause less degradation to the envelope-tracking signal 408 and/or the RF signals compared to a conventional design that transmits an analog envelope signal from a transceiver to an FEM. The RF signal, before being amplified by the power amplifier 17a, may be especially sensitive to spurious interference because of, for example, the relatively low power level compared to post-amplification. Thus, having LVDS lines 420 carrying oversampled LVDS signals from the transceiver 13 to the ET FEM 430 can help to maintain the integrity of the RF signal. Similarly, in a MIMO system, interference produced by the LVDS lines going to one ET FEM tends to cause less degradation to the envelope-tracking signal 408 or the RF signals of another ET FEM when compared with that of a design wherein analog envelope signals are transmitted from a transceiver to a plurality of FEMs instead of the LVDS signals. In addition, a larger bandwidth can be supported compared to systems that use analog envelope signals.

Further, by using digital signals to represent and transmit the envelope information, the size of the transceiver 13 or the ET FEM 430 can be reduced compared to systems that use an analog representation of the envelope signal. By staying within the digital realm, the DACs and ADCs in the envelope tracking system can be reduced or eliminated.

The clock signal 418 may also generate interference on an RF signal and/or the envelope-tracking signal 408 because some electrical coupling may occur within the transceiver 13 or within the communication subsystem 400. But because the clock signal 418 may operate at a much higher sample rate compared with the bandwidth of the RF signals and the envelope-tracking signal 408, interference the clock signal 418 may produce on these signals can appear like white noise as well. Thus, the interference produced by the clock signal 418 tends to cause less degradation to the RF signals and the envelope-tracking signal 408 when compared with that of a conventional design wherein an analog envelope signal is transmitted from a transceiver to an FEM.

In the ET FEM 430, a 1-bit D/A 422 may convert the LVDS signals to an analog signal. Advantageously, in certain embodiments, a single-bit data stream can be recovered without a clock signal or a separate clock signal. In particular, a sigma-delta bit stream may be recovered by low-pass filtering the analog signal generated by the 1-bit D/A 422. Thus, in some cases, the analog envelope-tracking signal can be recovered without routing the clock signal generated by clock 418 from transceiver 13 to ET FEM 430. Not routing the clock signal to the ET FEM 430 can eliminate a source of spurious interference, which may be present in some systems. Such spurious interference is undesirable in an RF system because, for example, the interference power at the fundamental frequency and the harmonics of the clock may cause degradation to the RF signal.

As discussed above, but not shown in FIG. 4, the D/A 422 may be followed by a low-pass filter (LPF) for data recovery. Alternatively, an LPF may be included as part of the D/A 422. This LPF may also shape the analog envelope-tracking signal to a bandwidth comparable to the bandwidth of the RF signal.

The output of the D/A 422 may be input to a driver 424. Driver 424 can generate an envelope-tracking signal 426 of sufficient power to function as a supply to the power amplifier 17a without causing the RF signal to be clipped. The envelope-tracking signal 426 may be electrically connected to the supply of the power amplifier 17a through a capacitor. The supply of the power amplifier 17a may also be electrically connected to a DC-to-DC converter (DC/DC) through an inductor.

Advantageously, in certain embodiments, the baseband signal may be used both to generate the RF signal for transmission and to perform envelope tracking. The envelope tracking may be used to adjust the power consumed by the power amplifier. Thus, in contrast to traditional wireless devices that maintain the power amplifier at the maximum supported power, embodiments herein can reduce power consumption by adjusting the power supplied to the power amplifier based at least in part on the envelope information derived from the baseband signal.

Another Example Envelope Tracking System

Figure 5:
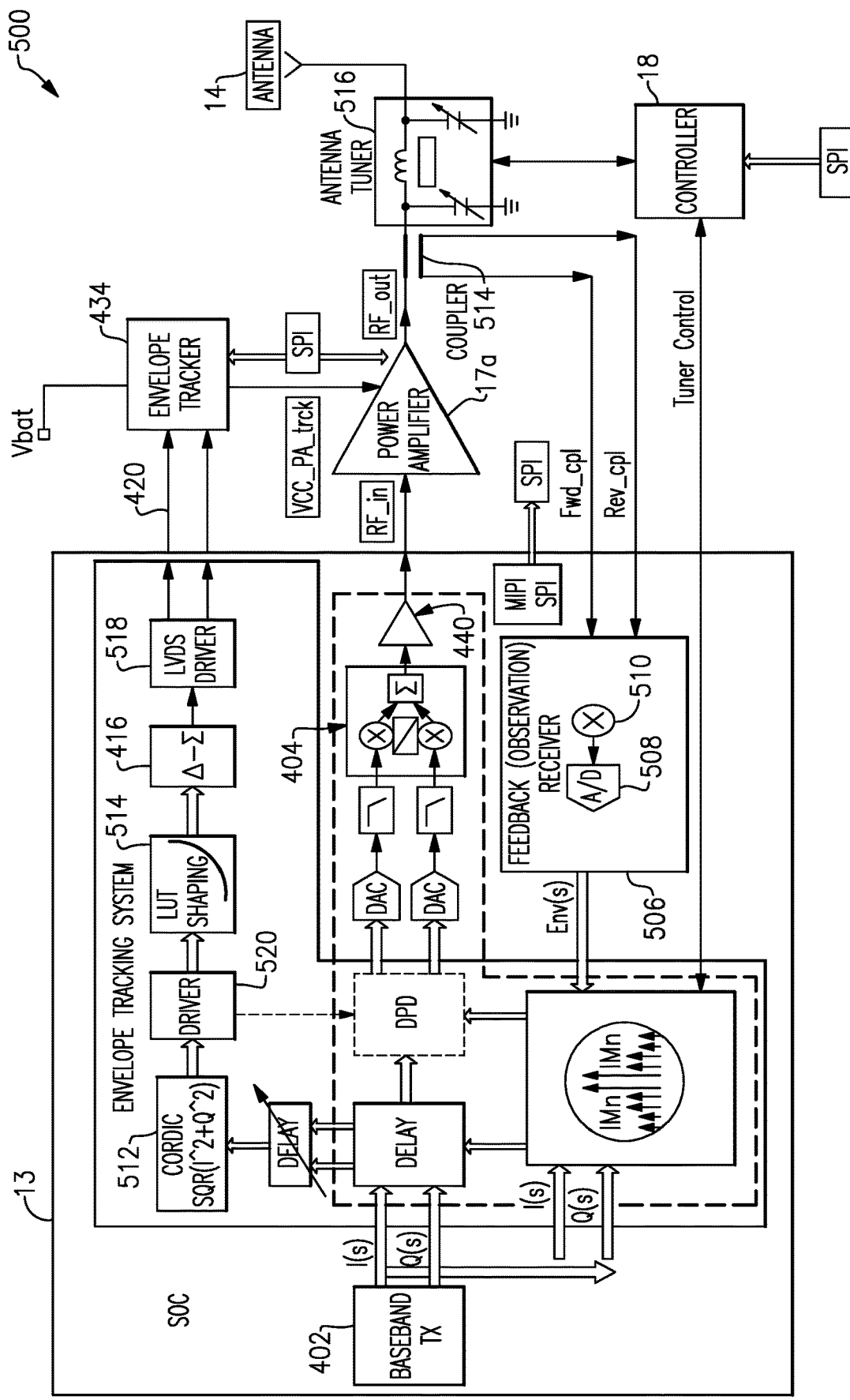
FIG. 5 is a more detailed block diagram of an embodiment of the communication subsystem of FIG. 4.

FIG. 5 illustrates another block diagram of an embodiment of the communication subsystem 500 including an envelope tracking system. The illustrated transceiver 13 includes a baseband processor 402, an I/O modulator 404, a signal estimation component 512, an LUT 514, a delta-sigma modulator 416, an LVDS driver 518, and a feedback (observation) receiver 506, which may include an A/D 508 and a mixer 510. The communication subsystem 500 additionally includes a power amplifier 17a, an envelope tracker 434, a directional coupler 514, an antenna tuner 516, an antenna 14, and a controller 18.

As discussed above, the baseband processor 402 can generate an I signal component and a Q signal component. The I/O modulator 504 can be configured to receive the I and Q signals from the baseband processor 402 and to process the I and Q signals to generate an RF signal. The signal estimation component 512 may be implemented as any system that can determine an approximate amplitude of the baseband I/O signals. Further, the signal estimation component 512 may be implemented in hardware, software, or a combination of hardware and software. In certain embodiments, as illustrated in FIG. 5 the signal estimation component 512 may implement a CORDIC algorithm. For example, the signal estimation component 512 may implement the following algorithm: CORDIC(SQR(I^2+Q^2)). CORDIC stands for COordinate Rotation DIgital Computer and may also be referred to as the digit-by-digit method or Voider's algorithm. CORDIC is an algorithm to calculate trigonometric functions which does not have to use multiply operations.

The output of the signal estimation component 512 may be provided to a driver 520. The driver 520 can amplify the signal received from the signal estimation component 512. This signal includes information associated with the baseband signal, such as the instantaneous amplitude of the baseband signal. The amplified signal may be provided to the LUT 514. Further, the driver 520 can provide the amplified signal, or a control signal based on the amplified signal, to a digital pre-distortion (DPD) element of the I/O modulator 404.

The LUT 514 can be used to convert an amplitude signal associated with the I and Q signals (e.g., the output of the signal estimation component 512) into a shaped envelope signal. In some cases, the content of the LUT may be dependent upon the implementation of the amplitude estimator. For example, the content of the LUT 414 may be different from that of the LUT 514 because LUT 414 receives its input from a signal estimation component 414 that implements a vector length function, whereas LUT 514 receives its input from a signal estimation component that implements a CORDIC function. In some cases, such as when the output of the signal estimation component 412 matches that of the signal estimation component 512, the content of the LUT 414 may be the same as that of the LUT 514.

The delta-sigma modulator 416 can encode the envelope signal using a single bit encoding. This single-bit encoding may be performed by applying delta-sigma modulation to the envelope signal output from LUT 514. The LVDS driver 518 can convert the output of the delta-sigma modulator 416 to the LVDS format. The output of the LVDS driver 518 can be transmitted on lines 420 to envelope tracker 434. In certain implementations, the envelope tracker 434 comprises a 1-bit D/A and a driver. The envelope tracker 434 may receive a voltage from a battery Vbat and may can modify the Vbat voltage based on the LVDS output 420 to generate the envelope-tracking voltage $V_{CC\_PA\_trck}$. Envelope tracker 434 can supply the envelope-tracking voltage $V_{CC\_PA\_trck}$ to the power amplifier 17a. $V_{CC\_PA\_trck}$ for the power amplifier 17a may change in relation to the shaped envelope signal. The power amplifier 17a can generate the output signal RF_out by amplifying the input signal RF_in. The RF_out signal may propagate to the antenna 14 via a directional coupler 514 (whose function is described below) and an antenna tuner 516. The RF signal can be then transmitted to a desired destination (e.g., a base station) via antenna 14.

The directional coupler 514 can be positioned between the output of the power amplifier 17a and the input of the switches 12 (not shown) or the input of the antenna tuner 516, thereby allowing an output power measurement of the power amplifier 17a that does not include insertion loss of the switches 12 or the antenna tuner 516. The sensed output signal from the directional coupler 514 can be provided to the mixer 510, which can multiply the sensed output signal by a reference signal of a controlled frequency (not illustrated in FIG. 5) so as to downshift the frequency spectrum of the sensed output signal. The downshifted signal can be provided to the ADC 508, which can convert the downshifted signal to a digital format suitable for processing by the baseband processor 402. By including a feedback path between the output of the power amplifier 17a and an input of the baseband processor 402, the baseband processor 402 can be configured to dynamically adjust the I and Q signals and/or envelope signal associated with the I and Q signals to optimize the operation of the communication subsystem 500. For example, configuring the communication subsystem 500 in this manner can aid in controlling the power added efficiency (PAE) and/or linearity of the power amplifier 17a.

Typically, the transmit RF frequency is selected based on a control or command received from a base station. However, in some cases, the communication subsystem 500 may select a transmit RF frequency based on user input or a command from the wireless device 11. Alternatively, the communication subsystem 500 may select a transmit RF frequency based on the power level indicated through the coupler 514. The controller 18 can control the transmit RF frequency through control signals to the I/O modulator 404 and the antenna tuner 516.

Another Illustration of an Envelope Tracking System

Figure 6:
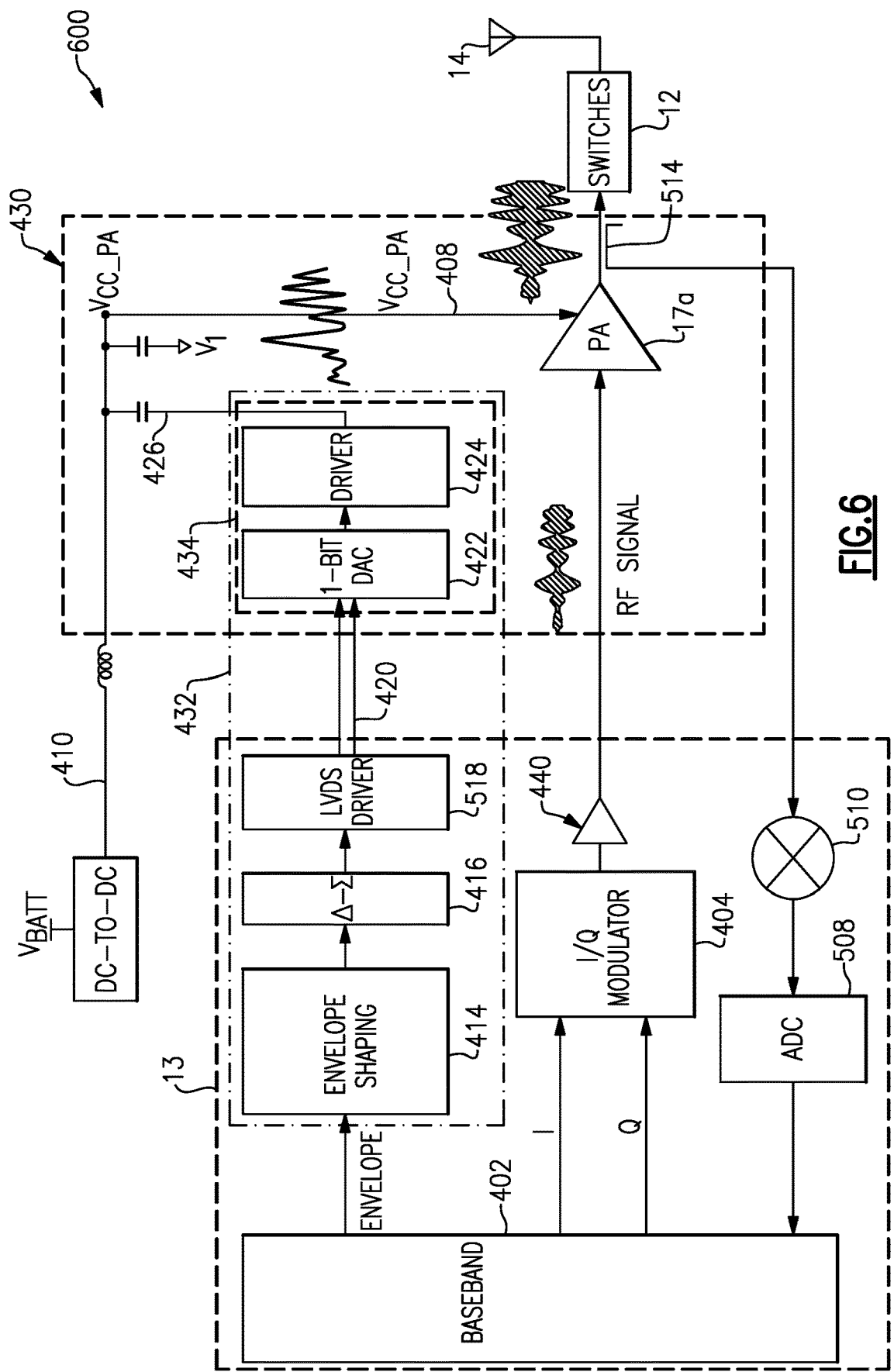
FIG. 6 is another block diagram of an embodiment of the communication subsystem introduced in FIG. 4.

FIG. 6 is another illustration of an envelope tracking system 600. As illustrated, the output 426 of the envelope tracker 434 is electrically connected to a DC-to-DC converter device through a capacitor and an inductor. Through these connections, the envelope tracker 434 modifies the DC-to-DC converter output 410 to generate an envelope-tracking supply voltage $V_{CC\_PA}$ 408. Also as illustrated in FIG. 6, a time-varying RF signal can be input to the power amplifier 17a. The power amplifier 17a can receive an envelope-tracking supply voltage $V_{CC\_PA}$ 408 and can output a time-varying amplified RF signal. The power of the amplified RF signal may vary, for example, depending on the distance between the communication subsystem 600 and the receiving device, such as a cellular base station receiver or a Wifi hotspot receiver. Thus it may be desirable to produce the envelope-tracking supply voltage $V_{CC\_PA}$ 408 based on the real-time variations of the amplified RF signal.

As with the envelope tracking systems depicted in FIGS. 5 and 6, the system 600 may include a baseband processor 402 that provides a signal to the envelope tracking system 432. The baseband signal can be used to adjust the power supplied to the PA 17a. Further, the baseband processor 402 may provide I and Q components of the baseband signal to the I/O modulator 404 to generate an RF signal for transmission.

Envelope Tracking System in a Wireless Device with Multiple Front-End Modules

Figure 7:
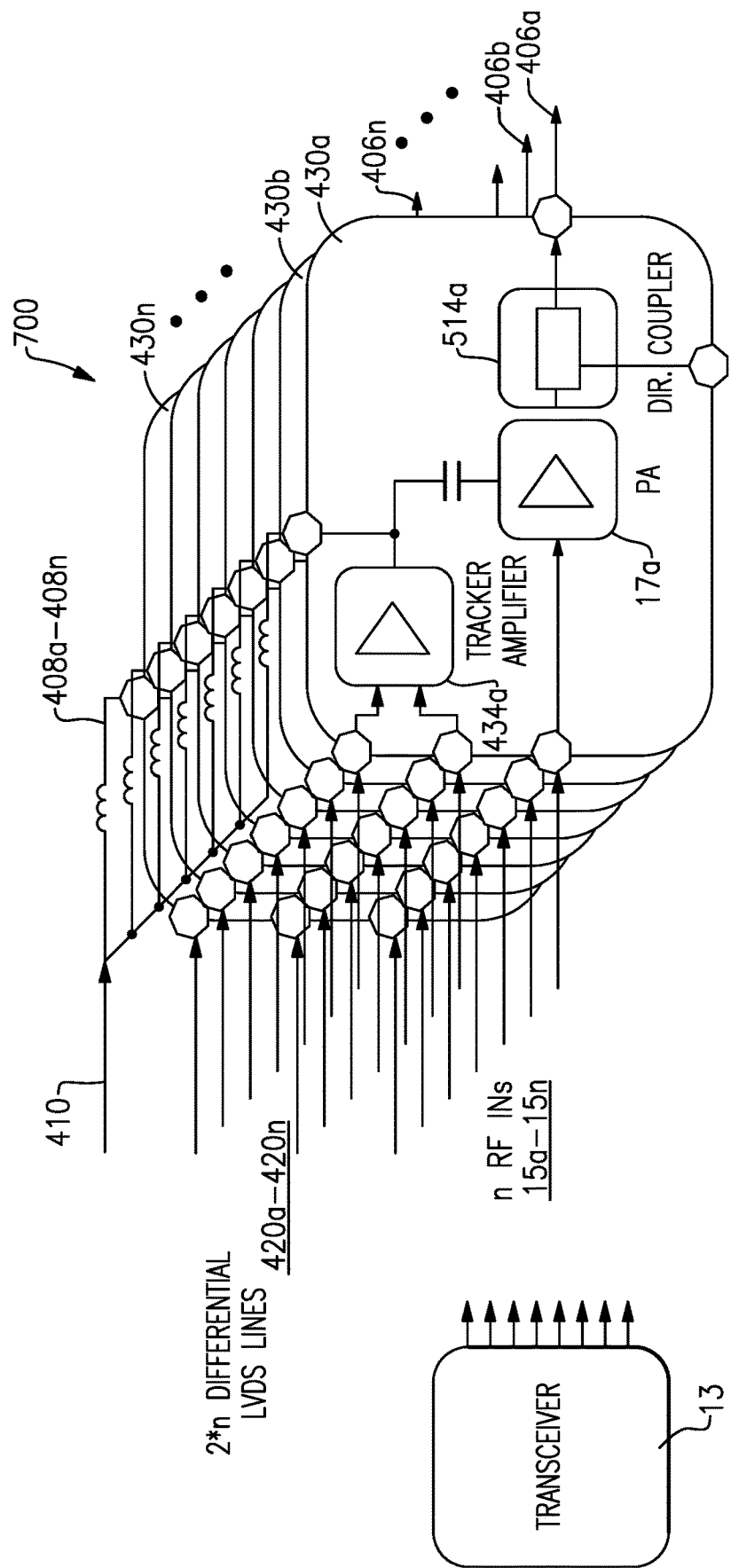
FIG. 7 illustrates a block diagram of one embodiment of a transceiver paired with multiple front end modules.

FIG. 7 illustrates a communication subsystem 700 comprising a transceiver 13 and a plurality of FEMs 430a-430n. Neither the number of FEMs (or their components) illustrated in FIG. 7 nor their reference numbers (e.g., 430a-430n) is meant to be limiting. A communication subsystem 700 may have any number of FEMs. In the remainder of the disclosure, an FEM in a wireless device may be individually referred to as FEM 430a, FEM 430b, etc., or may be individually or collectively referred to as FEM 430.

In FIG. 2, one or more output signals from the transceiver 13 are depicted as being provided to the antenna 14 via one or more transmission paths 15. As described above relative to FIG. 2, different transmission paths 15 can represent output paths associated with different bands and/or different power outputs. FIG. 7 illustrates an embodiment wherein the different transmission paths 15a-15n represent paths associated with different FEMs 430. Each FEM may have its own envelope tracker 434 and its own power amplifier 17. Further, each FEM may have its own transmission path 15 for the RF signal, and its own transmission path 420 for the LVDS signal. The RF signal input to one power amplifier may be different from the RF signal input to another power amplifier. Likewise, the LVDS signal input to one envelope tracker 434 may be different from the LVDS signal input to another envelope tracker 434. Thus, a plurality of transmission paths 15 and 420 may exist between the transceiver and the plurality of FEMs.

As discussed above, the different FEMs may be used in a MIMO system and may be spatially separated, leading to different path delays and frequency responses among paths 420a-420n. Advantageously, in certain embodiments, the degradation effects due, for example, to the different path lengths between the transceiver and the FEMs are reduced or eliminated compared with a conventional design because, for example, of the use of the single-bit LVDS signals as described above.

In some cases, signals communicated or electrically communicated via the paths 15 and 420 may cause mutual interference. For example, a signal path 420a may cause interference on another signal path, such as path 15b. This interference may cause distortion to the RF input signal because, for example, RF input signals are typically low-power signals. The RF input signals may be around 10 dBm, but can reach as low as −70 dBm. Typically, the LVDS signals are substantially close to 0 dBm. Advantageously, in certain embodiments, the degradation caused by cross-path interference may be reduced or eliminated compared with a conventional design because, for example, of the use of the single-bit LVDS signals as described above.

In operation, each FEM may transmit in one or more of a plurality of RF frequency bands. Furthermore, each FEM may not always transmit in a fixed frequency band. For example, FEM 430a may transmit using frequency band #1 at one time and transmit using frequency band #2 at another time. Thus the look-up table 414 may contain a plurality of mapping tables for each FEM, with each mapping table designated for a particular FEM transmitting using a particular RF frequency band. In operation, one table may be active for each FEM based on its transmit RF frequency band.

Example Envelope-Tracking Supply-Voltage Determination Process

Figure 8A:
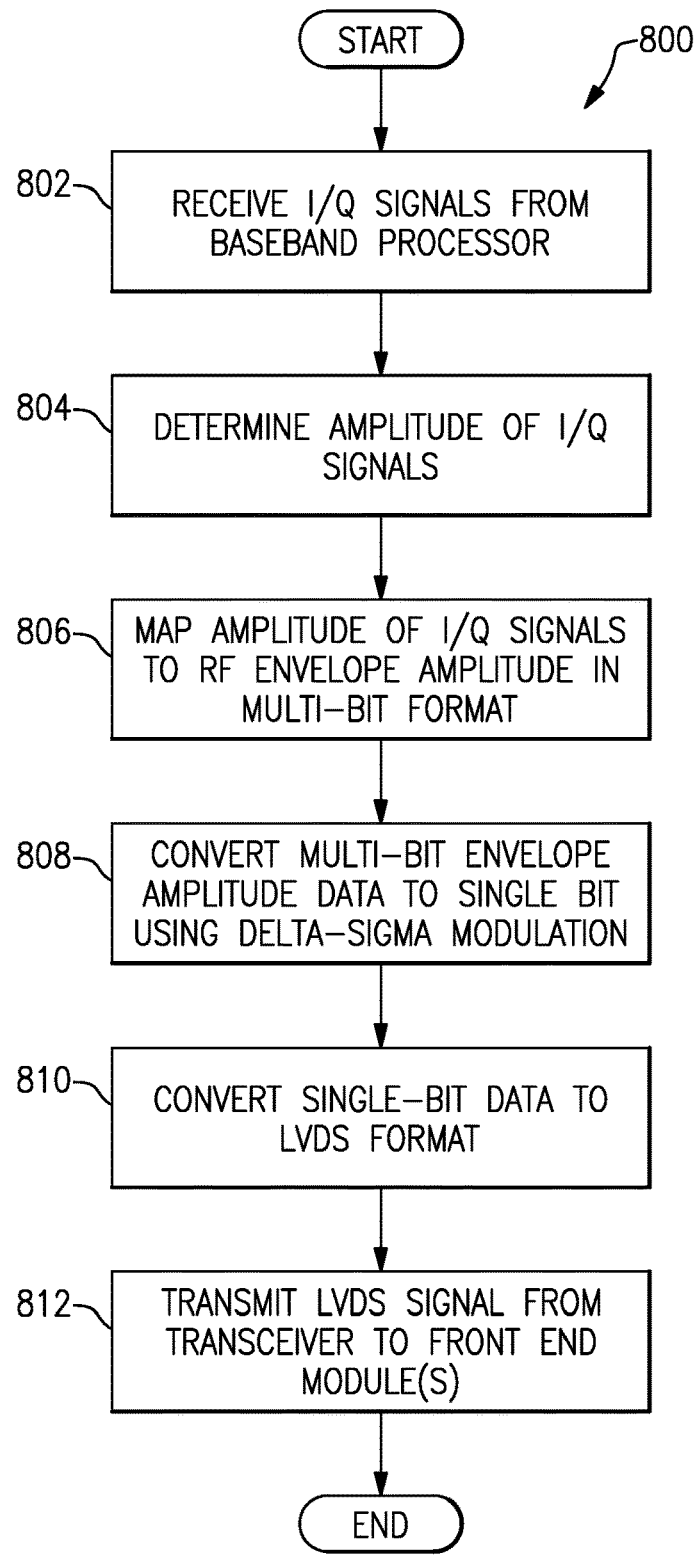
FIGS. 8A and 8B present two flowcharts relating to envelope-tracking supply voltage processes.

FIG. 8A presents a flowchart of an embodiment of an envelope-tracking supply voltage determination process 800. The process 800 can be implemented by any system that can configure a power amplifier supply voltage based, at least in part, on the RF signal voltage being used to communicate with another device, such as a cellular base station. For example, the process 800 may be performed by a signal estimation component 412, a signal estimation component 512, a look-up table such as LUT 414 or 514, a sigma-delta modulator 416, a clock 418, and a LVDS driver 518. Although one or more systems may implement the process 800, in whole or in part, to simplify discussion, the process 800 will be described with respect to particular systems.

The process 800 begins at the block 802 where, for example, a signal estimation component 412 receives an I/O baseband signal from a baseband processor 402. At block 804, the signal estimation component can estimate or measure the magnitude of the I/O baseband signal. As discussed above, this estimate or measurement may be implemented in a variety of ways such as using a vector length function or a CORDIC function. Additionally, some systems may compute the magnitude of the I/O baseband signal in the baseband processor. In such systems, the baseband processor can output the magnitude directly to the envelope tracking system 432.

At block 806, the envelope tracking system can determine an RF envelope amplitude based on the I/O signal magnitude. This may be done via a look-up table, such as LUT 414 or LUT 514. The I/O signal magnitude and RF envelope amplitude may be represented as a digital word of a number of bits, e.g., 8 or 12 bits. The relatively small number of bits can permit an efficient implementation of a look-up table as the size of the table can be proportional to the number of digital states, e.g., $2^8$ or 256 for an 8-bit word.

At block 808, the envelope tracking system may use a delta-sigma modulator 416 to convert the multi-bit RF envelope signal to a single bit. To maintain the information in the multi-bit signal using a single bit, the delta-sigma modulator may output a single-bit data signal at an over-sample clock rate. A clock source 418 may be used to supply a clock signal to the delta-sigma modulator.

At block 810, the envelope tracking system may convert the single-bit data signal to an LVDS format. The system may include an LVDS driver 518 to perform this conversion. The system can transmit the LVDS-formatted signal to one or more front-end modules at block 812.

Example Envelope-Tracking Supply-Voltage Supply Process

Figure 8B:
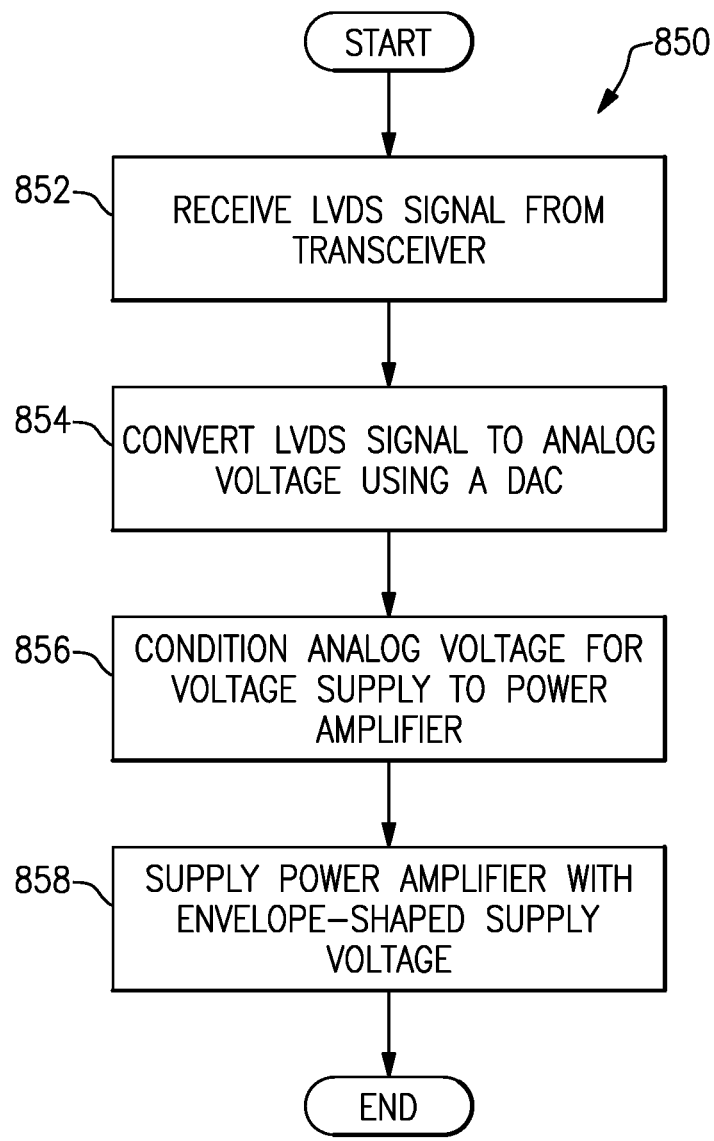

FIG. 8B presents a flowchart of an embodiment of an envelope-tracking supply voltage supply process 850. Like process 800, the process 850 can be implemented by any system that can configure a power amplifier supply voltage based, at least in part, on the RF signal voltage being used to communication with another device, such as a cellular base station. In some cases, the processes 800 and 850 can represent two complementary processes to generate an envelope-tracking power supply voltage. As an example, the process 850 may be performed by a one-bit D/A 422 and/or a driver 424. The output of the driver 424 can be an envelope-tracking supply voltage to a power amplifier 17*a*. Although one or more systems may implement the process 850, in whole or in part, to simplify discussion, the process 850 will be described with respect to particular systems.

The process 850 starts at block 852 where, for example, an envelope tracker 434 may receive an LVDS signal from a transceiver 13. At block 854, the envelope tracker converts the LVDS signal to an analog envelope tracking signal. This conversion may be performed using a one-bit D/A 422. The one-bit D/A 422 may use a low pass filter to filter the signal based at least in part on the bandwidth of the envelope of the RF signal. In certain embodiments, the analog envelope tracking signal produced in block 854 can be correlated, in the time domain for instance, to the RF envelope amplitude signal produced in block 806.

At block 856, the envelope tracker 434 conditions the analog envelope tracking signal based on the power amplifier 17*a*. Conditioning the analog envelope tracking signal may involve, for example, boosting the current level to a level which may be required by a particular implementation of a power amplifier. As another example, the process in block 856 may involve offsetting and/or scaling the voltage of the analog envelope tracking signal to satisfy the supply voltage range which may be required by the particular implementation of the power amplifier. At block 858, the system can supply the conditioned envelope tracking signal to a power amplifier.

Example Delta-Sigma Modulator Output and Envelope Tracking Supply Voltage

Figure 9:
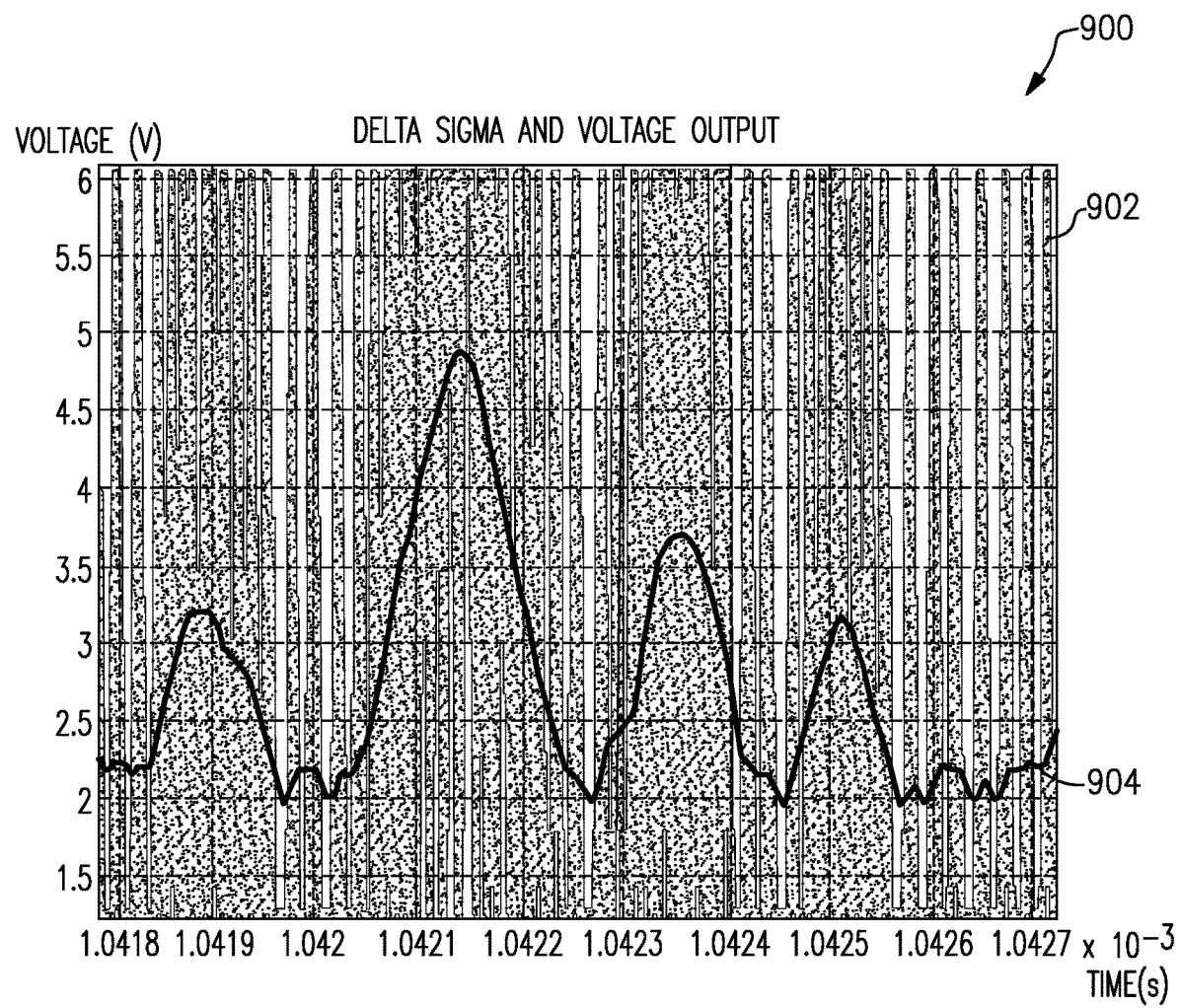
FIG. 9 presents a graph of one example of delta sigma modulator output voltage and a corresponding envelope tracker output voltage versus time.

FIG. 9 illustrates a graph 900 of the output of the delta-sigma modulator 902 (thin line with dotted areas) and the corresponding envelope-tracking signal 904 (thick line). The delta-sigma modulator output 902 may be associated with either a logical zero or a logical one. The logical state at a particular sample may depend on the slope of the corresponding envelope-tracking signal 904 as discussed above. In cases where the slope has frequent polarity changes, the delta sigma output 902 can oscillate quickly between the two logic states. On graph 900 with a compressed time axis, such quick oscillations appear to form a cluster, represented with dotted areas enclosed by a thin line. For example, a cluster appears around Time=1.0419 milliseconds. The voltages of the logic zero and one states of the delta-sigma modulator output may be scaled. In graph 900, the delta-sigma modulator 902 is scaled between about 1.25 V to over 6 V. The scaling may be done such that the envelope tracking system produces an envelope tracking signal 904 with a voltage range that satisfies the voltage required by a particular implementation of a power amplifier.

Example Ideal and Achieved Envelope Tracking Supply Voltage

Figure 10:
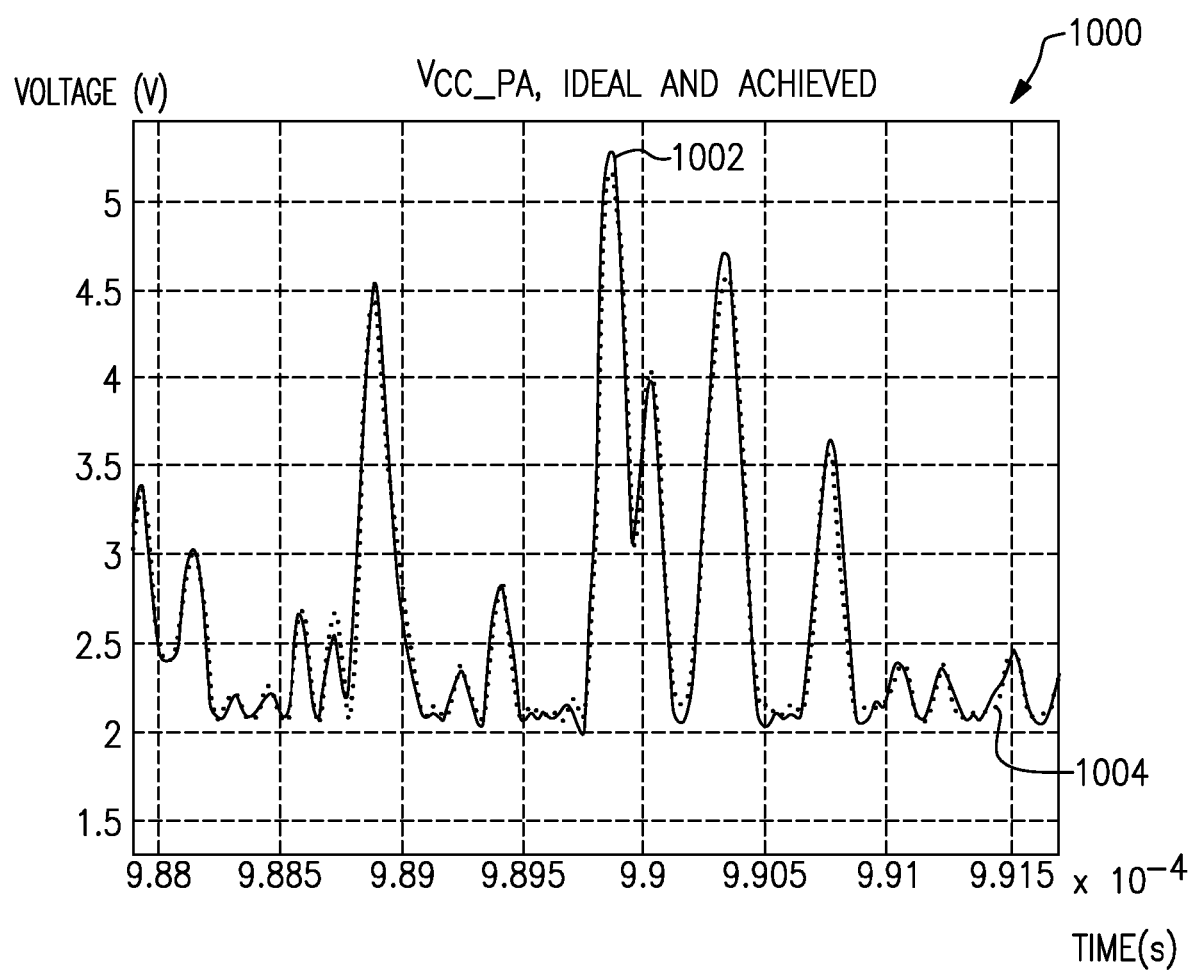
FIG. 10 presents a graph of an example envelope tracker output voltage and a corresponding theoretically ideal output voltage versus time.

FIG. 10 illustrates a graph 1000 showing an ideal envelope tracking signal 1002 (solid line) and an envelope tracking signal achievable through a certain embodiment 1004 (dotted line). Although the two signals 1002 and 1004 are not identical in shape, the differences may be attributed to various sources of error in the envelope tracking system, for example magnitude estimation or measurement error. However, the graph 1000 illustrates that the achievable output 1004 tracks closely the ideal output 1002 demonstrating that certain embodiments herein can be used to generate an envelope-tracking signal while achieving the advantages described herein.

Example Spectral Density

Figure 11:
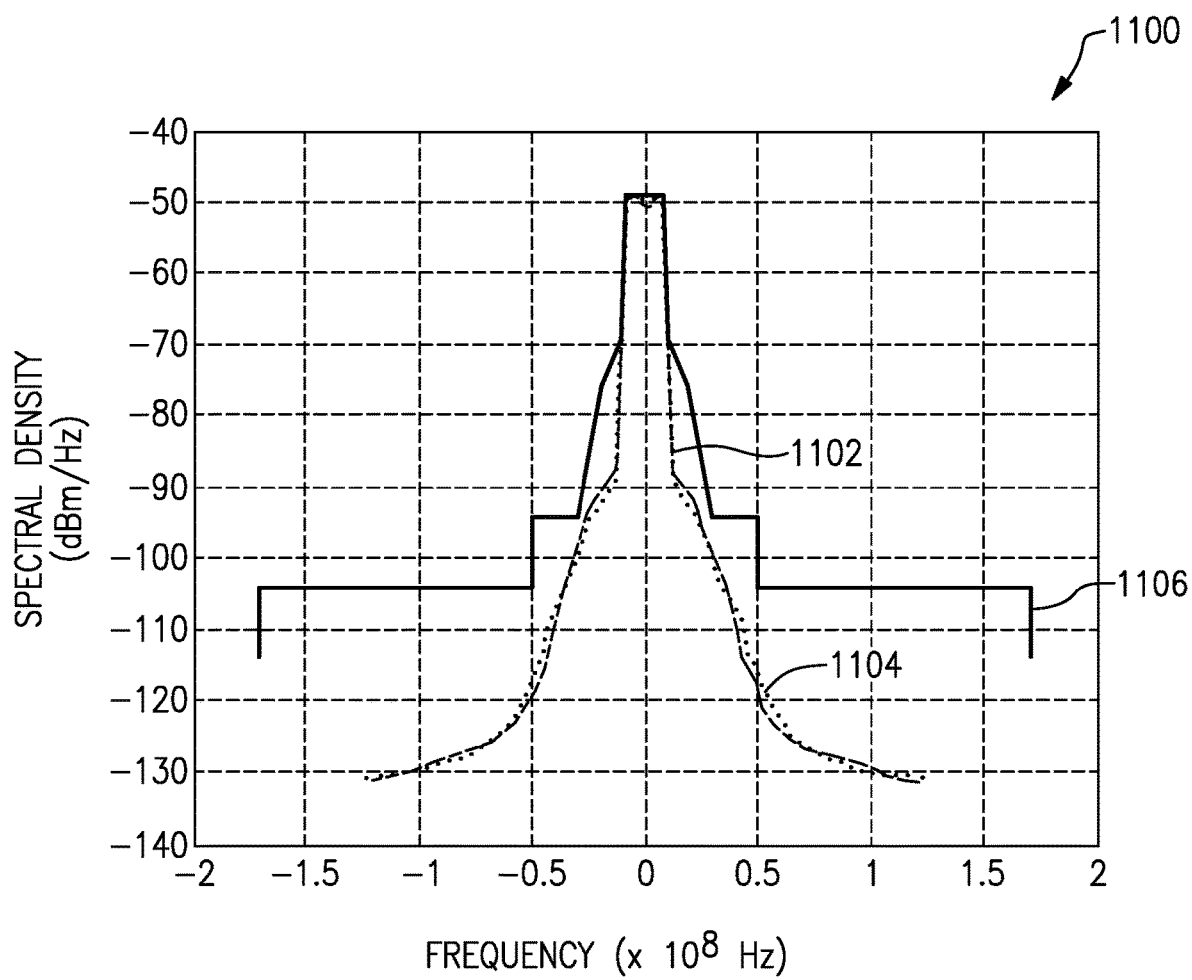
FIG. 11 presents a graph of an example envelope tracker output spectral density and a corresponding theoretically ideal output spectral density versus spectral density requirement of a communication scheme.

FIG. 11 illustrates a graph 1100 of spectral densities versus frequency. Curve 1102 (thin solid line) is spectral density of an example RF signal amplified through a power amplifier with an ideal envelope tracking supply voltage. Curve 1104 (dotted line) is the spectral density of the same example RF signal amplified through a power amplifier with an envelope tracking signal achievable through a certain embodiment. Line 1106 (thick solid line) shows an example spectral density requirement which may be imposed by a certain communication system or standard. The two spectral densities 1102 and 1104 are not identical in shape. As described above in relation to FIG. 10 above, the differences may be attributed to various sources of error in the envelope tracking system, for example magnitude estimation or measurement error. However, the showing that the achievable spectral density 1104 tracks closely the ideal spectral density 1102 demonstrates that certain embodiments described herein can be used to generate a good envelope-tracking signal.

One measure of a "good" envelope-tracking signal may be whether the resulting RF spectral density, such as curve 1104, meets the spectral density requirements which may be imposed by a certain communication system or standard, e.g., line 1106. The line 1106 may represent a power requirement within the RF bandwidth, e.g. about −50 dBm/Hz from about −15 MHz to +15 MHz. The line 1106 may also represent adjacent channel rejection requirements, e.g. about −95 dBm/Hz from about 30 to 50 MHz away from the center of the RF channel (shown in graph 1100 as 0 Hz), and about −103 dBm/Hz from about 50 MHz to 170 MHz away from the center of the RF channel. As illustrated in graph 1100, the curve 1104 meets these spectral density requirements which may be imposed by a certain communication system or standard. Thus the envelope tracking signal may be considered "good."

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system comprising:
at least one transceiver having a signal measuring device configured to determine a size of at least one radio frequency input signal and one or more a bit-encoders configured to provide a plurality of encoded envelope tracking control signals having a plurality of pairs of low-voltage digital differential signaling lines, at least one of the pairs of low-voltage digital differential signaling lines is of a different length than at least one other pair of low-voltage digital differential signaling lines, the plurality of encoded envelope tracking control signals based at least in part on a size of the at least one radio frequency input signal; and
a plurality of envelope trackers in communication with the plurality of encoded envelope tracking control signals, the plurality of envelope trackers configured to provide a plurality of supply voltages to a plurality of power amplifiers, the plurality of supply voltages based at least in part on the plurality of encoded envelope tracking control signals.

2. The envelope tracking system of claim 1 wherein the signal measuring device determines the size of the radio frequency input signal by determining an amplitude of I and Q components of a baseband signal associated with the radio frequency input signal.

3. The envelope tracking system of claim 2 wherein determining the amplitude of the radio frequency input signal includes obtaining an absolute value of the amplitude of the I and Q components associated with the RF input signal.

4. The envelope tracking system of claim 1 wherein the signal measuring device implements a coordinate rotation digital computer algorithm.

5. The envelope tracking system of claim 1 wherein at least one of the plurality of bit-encoders includes a sigma-delta modulator.

6. The envelope tracking system of claim 1 further comprising a lookup table storing a plurality of envelope tracking control values.

7. The envelope tracking system of claim 6 wherein one or more of the encoded envelope tracking control signals is generated based at least in part on the size of the radio frequency input signal or a selection of an envelope tracking control value from the plurality of envelope tracking control values.

8. The envelope tracking system of claim 1 wherein at least one of the pairs of low-voltage digital differential signaling lines has a different path delay than at least one other pair of low-voltage digital differential signaling lines.

9. The envelope tracking system of claim 1 wherein at least one of the plurality of envelope trackers includes a digital to analog converter configured to convert an encoded envelope tracking control signal to an analog signal.

10. The envelope tracking system of claim 1 wherein at least one of the plurality of envelope trackers includes a driver configured to generate at least one of the plurality of supply voltages.

11. The envelope tracking system of claim 1 wherein the size of the radio frequency input signal comprises an instantaneous amplitude of the radio frequency input signal.

12. A wireless device comprising:
at least one transceiver including at least one signal measuring device and one or more bit-encoders, the signal measuring device configured to determine a size of at least one radio frequency input signal, and the one or more bit-encoders configured to provide a plurality of encoded envelope tracking control signals having via a plurality of pairs of low-voltage digital differential signaling lines, at least one of the pairs of low-voltage digital differential signaling lines is of a different length than at least one other pair of low-voltage digital differential signaling lines, the plurality of encoded envelope tracking control signals based at least in part on the size of the at least one radio frequency input signal; and
a plurality of envelop trackers in communication with the transceiver, the plurality of envelope trackers configured to provide a plurality of supply voltages to a plurality of power amplifiers, the plurality of supply voltages based at least in part on the encoded envelope tracking control signals.

13. The wireless device of claim 12 wherein the wireless device includes one or more power amplifiers configured to process signals of different frequency bands.

14. The wireless device of claim 13 wherein at least one of the pairs of low-voltage digital differential signaling lines has a different path delay than at least one other pair of low-voltage digital differential signaling lines.

15. The wireless device of claim 12 wherein at least one of the plurality of bit-encoders includes a sigma-delta modulator.

16. The wireless device of claim 12 wherein the transceiver further includes a non-volatile storage configured to store a mapping of a plurality of radio frequency input size values to a plurality of envelope tracking control values.

17. The wireless device of claim 16 wherein at least one of the plurality of envelope tracking control signals is determined based at least in part on the size of the radio frequency input signal and the mapping of the plurality of radio frequency input size values to the plurality of envelope tracking control values.

18. The wireless device of claim 12 wherein at least one of the plurality of envelope trackers includes a digital to analog converter configured to convert the encoded envelope tracking control signal to an analog signal.

19. The wireless device of claim 12 wherein at least one of the plurality of envelope trackers includes a driver configured to modify a voltage received from a battery to obtain the supply voltage for the power amplifier.

20. A method of envelope-tracking a radio frequency signal, the method comprising:
receiving I and Q components of a radio frequency signal;
determining an expected size of the radio frequency signal based on a measurement of the I and Q components;
determining a plurality of control signals based at least in part on the expected size of the radio frequency signal, the plurality of control signals indicating a plurality of voltage envelopes for the radio frequency signal; and
transmitting the plurality of control signals to a plurality of envelope trackers via a plurality of pairs of low-voltage digital differential signaling lines, at least one of the pairs of low-voltage digital differential signaling lines is of a different length than at least one other pair of low-voltage digital differential signaling lines.

* * * * *